United States Patent
Choi et al.

(10) Patent No.: US 7,019,819 B2
(45) Date of Patent: Mar. 28, 2006

(54) CHUCKING SYSTEM FOR MODULATING SHAPES OF SUBSTRATES

(75) Inventors: Byung J. Choi, Round Rock, TX (US); Ronald D. Voisin, Austin, TX (US); Sidlgata V. Sreenivasan, Austin, TX (US); Michael P. C. Watts, Austin, TX (US); Daniel Babbs, Austin, TX (US); Mario J. Meissl, Austin, TX (US); Hillman Bailey, Dripping Springs, TX (US); Norman E. Schumaker, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 237 days.

(21) Appl. No.: 10/293,224

(22) Filed: Nov. 13, 2002

(65) Prior Publication Data

US 2004/0090611 A1   May 13, 2004

(51) Int. Cl.
G03B 27/62 (2006.01)
G03B 27/42 (2006.01)
G03B 27/60 (2006.01)
H01L 21/4763 (2006.01)

(52) U.S. Cl. .............................. 355/75; 355/53; 355/73; 438/638

(58) Field of Classification Search ................ 355/53, 355/73, 75, 72, 76; 216/52, 2, 44, 67, 72; 438/691, 700, 735, 638
See application file for complete search history.

(56) References Cited

U.S. PATENT DOCUMENTS 3,783,520 A   1/1974   King
4,070,116 A   1/1978   Frosch et al.
4,119,688 A   10/1978   Hiraoka (Continued)

FOREIGN PATENT DOCUMENTS

DE   2800476   7/1978
JP   55-88332   12/1978
JP   57-7931   6/1980

(Continued)

OTHER PUBLICATIONS

Krauss et al., "Fabrication of Nanodevices Using Sub–25nm Imprint Lithography," Appl. Phys. Lett 67(21), 3114–3116, 1995.

Chou et al., "Imprint of Sub–25 nm Vias and Trenches in Polymers," Applied Physics Letters, Nov. 20, 1995, pp. 3114–3116, vol. 67(21).

Chou et al., "Imprint Lithography with 25–Nanometer Resolution," Science, Apr. 5, 1996, pp. 85–87, vol. 272.

(Continued)

*Primary Examiner*—Peter B. Kim
(74) *Attorney, Agent, or Firm*—Kenneth C. Brooks

(57) ABSTRACT

The present invention is directed to a chucking system to modulate substrates so as to properly shape and position the same with respect to a wafer upon which a pattern is to be formed with the substrate. The chucking system includes a chuck body having first and second opposed sides. A side surface extends therebetween. The first side includes first and second spaced-apart recesses defining first and second spaced-apart support regions. The first support region cinctures the second support region and the first and second recesses. The second support region cinctures the second recess, with a portion of the body in superimposition with the second recess being transparent to radiation having a predetermined wavelength. The second side and the side surface define exterior surfaces. The body includes throughways placing the first and second recesses in fluid communication with one of the exterior surfaces.

24 Claims, 9 Drawing Sheets

U.S. PATENT DOCUMENTS

| | | |
|---|---|---|
| 4,201,800 A | 5/1980 | Alcorn et al. |
| 4,426,247 A | 1/1984 | Tamamura et al. |
| 4,507,331 A | 3/1985 | Hiraoka |
| 4,552,833 A | 11/1985 | Ito et al. |
| 4,600,309 A | 7/1986 | Fay |
| 4,657,845 A | 4/1987 | Frechet et al. |
| 4,692,205 A | 9/1987 | Sachdev et al. |
| 4,707,218 A | 11/1987 | Giammarco et al. |
| 4,724,222 A | 2/1988 | Feldman |
| 4,731,155 A | 3/1988 | Napoli et al. |
| 4,737,425 A | 4/1988 | Lin et al. |
| 4,808,511 A | 2/1989 | Holmes |
| 4,826,943 A | 5/1989 | Ito et al. |
| 4,848,911 A | 7/1989 | Uchida et al. |
| 4,857,477 A | 8/1989 | Kanamori |
| 4,891,303 A | 1/1990 | Garza et al. |
| 4,908,298 A | 3/1990 | Hefferon et al. |
| 4,919,748 A | 4/1990 | Bredbenner et al. |
| 4,921,778 A | 5/1990 | Thackeray et al. |
| 4,931,351 A | 6/1990 | McColgin et al. |
| 4,964,945 A | 10/1990 | Calhoun |
| 4,976,818 A | 12/1990 | Hashimoto et al. |
| 4,980,316 A | 12/1990 | Huebner |
| 4,999,280 A | 3/1991 | Hiraoka |
| 5,053,318 A | 10/1991 | Gulla et al. |
| 5,071,694 A | 12/1991 | Uekita et al. |
| 5,074,667 A | 12/1991 | Miyatake |
| 5,108,875 A | 4/1992 | Thackeray et al. |
| 5,148,036 A | 9/1992 | Matsugu et al. |
| 5,148,037 A | 9/1992 | Suda et al. |
| 5,151,754 A | 9/1992 | Ishibashi et al. |
| 5,169,494 A | 12/1992 | Hashimoto et al. |
| 5,173,393 A | 12/1992 | Sezi et al. |
| 5,179,863 A | 1/1993 | Uchida et al. |
| 5,198,326 A | 3/1993 | Hashimoto et al. |
| 5,212,147 A | 5/1993 | Sheats |
| 5,234,793 A | 8/1993 | Sebald et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,431,777 A | 7/1995 | Austin et al. |
| 5,439,766 A | 8/1995 | Day et al. |
| 5,453,157 A | 9/1995 | Jeng |
| 5,458,520 A | 10/1995 | DeMercurio et al. |
| 5,468,542 A | 11/1995 | Crouch |
| 5,515,167 A | 5/1996 | Ledger et al. |
| 5,527,662 A | 6/1996 | Hashimoto et al. |
| 5,654,238 A | 8/1997 | Cronin et al. |
| 5,669,303 A | 9/1997 | Maracas et al. |
| 5,670,415 A | 9/1997 | Rust |
| 5,700,626 A | 12/1997 | Lee et al. |
| 5,736,424 A | 4/1998 | Prybyla et al. |
| 5,743,998 A | 4/1998 | Park |
| 5,772,905 A | 6/1998 | Chou |
| 5,855,686 A | 1/1999 | Rust |
| 5,895,263 A | 4/1999 | Carter et al. |
| 5,900,160 A | 5/1999 | Whitesides et al. |
| 5,907,782 A | 5/1999 | Wu |
| 5,926,690 A | 7/1999 | Toprac et al. |
| 5,948,219 A | 9/1999 | Rohner |
| 5,948,470 A | 9/1999 | Harrison et al. |
| 5,948,570 A | 9/1999 | Kornblit et al. |
| 6,033,977 A | 3/2000 | Gutsche et al. |
| 6,035,805 A | 3/2000 | Rust |
| 6,039,897 A | 3/2000 | Lochhead et al. |
| 6,096,655 A | 8/2000 | Lee et al. |
| 6,137,562 A * | 10/2000 | Masuyuki et al. ............ 355/73 |
| 6,150,231 A | 11/2000 | Muller et al. |
| 6,150,680 A | 11/2000 | Eastman et al. |
| 6,245,581 B1 | 6/2001 | Bonser et al. |
| 6,274,294 B1 | 8/2001 | Hines |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,383,928 B1 | 5/2002 | Eissa |
| 6,387,783 B1 | 5/2002 | Furukawa et al. |
| 6,388,253 B1 | 5/2002 | Su |
| 6,391,798 B1 | 5/2002 | DeFelice et al. |
| 6,455,411 B1 | 9/2002 | Jiang et al. |
| 6,482,742 B1 | 11/2002 | Chou |
| 6,489,068 B1 | 12/2002 | Kye |
| 6,514,672 B1 | 2/2003 | Young et al. |
| 6,518,168 B1 | 2/2003 | Clem et al. |
| 6,534,418 B1 | 3/2003 | Plat et al. |
| 6,541,360 B1 | 4/2003 | Plat et al. |
| 6,561,706 B1 | 5/2003 | Singh et al. |
| 6,565,928 B1 | 5/2003 | Sakamoto et al. |
| 6,632,742 B1 | 10/2003 | Yang et al. |
| 6,635,581 B1 | 10/2003 | Wong |
| 6,646,662 B1 | 11/2003 | Nebashi et al. |
| 6,677,252 B1 | 1/2004 | Marsh |
| 6,696,220 B1 | 2/2004 | Bailey et al. |
| 6,703,190 B1 | 3/2004 | Elian et al. |
| 6,716,767 B1 | 4/2004 | Shih et al. |
| 6,730,256 B1 | 5/2004 | Bloomstein et al. |
| 6,737,202 B1 | 5/2004 | Gehoski et al. |
| 6,743,713 B1 | 6/2004 | Mukherjee-Roy et al. |
| 6,767,983 B1 | 7/2004 | Fujiyama et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 2002/0093122 A1 | 7/2002 | Chio et al. |
| 2002/0094496 A1 | 7/2002 | Stepanian et al. |
| 2002/0098426 A1 | 7/2002 | Sreenivasan et al. |
| 2002/0132482 A1 | 9/2002 | Chou |
| 2002/0167117 A1 | 11/2002 | Chou |
| 2003/0080471 A1 | 5/2003 | Chou |
| 2003/0081193 A1 | 5/2003 | White et al. |
| 2003/0092261 A1 * | 5/2003 | Kondo et al. ............... 438/638 |
| 2003/0113638 A1 | 6/2003 | Mancini et al. |
| 2003/0129542 A1 | 7/2003 | Shih et al. |
| 2003/0179354 A1 * | 9/2003 | Araki et al. .................. 355/53 |
| 2004/0029041 A1 | 2/2004 | Shih et al. |
| 2004/0036201 A1 | 2/2004 | Chou et al. |
| 2004/0192041 A1 | 9/2004 | Jeong et al. |

FOREIGN PATENT DOCUMENTS

| | | |
|---|---|---|
| JP | 63-138730 | 12/1986 |
| JP | 1-196749 | 8/1989 |
| JP | 02-24848 | 1/1990 |
| JP | 02-92603 | 4/1990 |
| WO | WO 00/21689 | 4/2000 |
| WO | WO 01/47003 A2 | 6/2001 |
| WO | WO 01/69317 | 9/2001 |
| WO | WO 01/79592 | 10/2001 |

| | | |
|---|---|---|
| WO | WO 01/79933 | 10/2001 |
| WO | WO 01/90816 | 11/2001 |

OTHER PUBLICATIONS

Haisma et al., "Mold–Assisted Nanolithography: A Process for Reliable Pattern Replication," Journal of Vacuum Science and Technology, Nov./Dec. 1996, pp. 4124–4128, vol. B 14(6).

Chou et al., "Imprint Lithography with Sub–10nm Feature Size and High Throughput," Microelectronic Engineering, 1997, pp. 237–240, vol. 35.

Mittal et al., "Precision Motion Control of Magnetic Suspension Actutator Using a Robust Nonlinear Compensation Scheme," IEEE/ASME Transactions on Mechatronics, Dec. 1997, pp. 268–280, vol. 2, No. 4.

Lee et al., "An Ultraprecision Stage for Alignment of Wafers in Advanced Microlithography," Precision Engineering, 1997, pp. 113–122, vol. 21, Elsevier Science Inc., 655 Avenue of the Americas, NY, NY 10010.

Koseki et al., "Design and Accuracy Evaluation of High–Speed and High–Precision Parallel Mechanism," Proc. of the 1998 IEEE, Intl. Conf. on Robotics & Automation, May 1998, pp. 1340–1345, Leuven, Belgium.

Kim et al., "High Precision Magnetic Levitation Stage for Photolithography," Precision Engineering, 1998, pp. 66–77, vol. 22, Elsevier Science Inc., 655 Avenue of the Americas, NY, NY 10010.

Mansky et al., "Large–Area Domain Alignment in Block Copolymer Thin Films Using Electric Fields," Macromolecules, 1998, pp. 4399–4401, vol. 31.

Feldman et al., "Wafer chuck for manification correction in x–ray lithography," American Vacuum Society, 1998, pp. 3476–3479.

Scheer et al., "Problems of the Nanoimprinting Technique for Nanometer Scale Pattern Definition," Journal of Vaccum Science and Technology, Nov./Dec. 1998, pp. 3917–3921, vol. B 16(6).

Lee et al., "Ultra Precision Positioning System for Servo Motor–Piezo Actuator Using the Dual Servo Loop and Digital Filter Implementation," ASPE, 1998, pp. 287–290, vol. 18.

Ohya et al., "Development of 3–DOF Finger Module for Micro Manipulation," Proc. of the 1999 IEEE/RSJ, Int. Conf. on Intelligent Robots and Systems, 1999, pp. 894–899.

Tanikawa et al., "Development of Small–Sized 3 DOF Finger Moldule in Micro Hand for Micro Manipulation," Proc. of the IEEE/RSJ, Intl. Conf. on Intelligent Robots and Systems, 1999, pp. 876–881.

Ruchhoeft et al., "Patterning Curved Surfaces: Template Generation by Ion Beam Proximity Lithography and Relief Transfer by Step and Flash Imprint Lithography," Journal of Vacuum Science and Technology, 1999, pp. 2965–2982, vol. 17.

Choi et al., "Design of Orientation Stages for Step and Flash Imprint Lithography," Precision Engineering, Journal of the International Societies for Precision Engineering and Nanotechnology, 2001, pp. 192–199, vol. 25.

Choi et al., "High Precision Orientation Alignment and Gap Control Stages for Imprint Lithography Processes," U.S. Appl. No. 09/693,317, filed Oct. 27, 2000.

Choi et al., "A Method for Modulating Shapes of Substrates," U.S. Appl. No. 10/316,963, filed Dec. 11, 2002.

Krug et al., "Fine Patterning of Thin Sol–Gel Films," Journal of Non–Crystalline Solids, 1992, pp. 447–450, vol. 147 & 148.

Colburn et al., "Step and Flash Imprint Lithography: A New Approach to High–Resolution Patterning," Proc. Of SPIE, 1999, pp. 379–389 vol. 3676.

Chou et al, "Lithography–Induced Self Assembly of Periodic Micropillar Arrays," Journal of Vacuum Science and Technology, Nov./Dec. 1999, pp. 3197–3202, vol. B17(6).

Voisin, "Methods of Manufacturing a Lithography Template," U.S. Appl. No. 10/136,188, filed May 1, 2002.

Sreenivasan et al., "Step and Repeat Imprint Lithography Systems," U.S. Appl. No. 10/194,414, filed Jul. 11, 2002.

Sreenivasan et al., "Step and Repeat Imprint Lithography Processes," U.S. Appl. No. 10/194,991, filed Jul. 11, 2002.

Otto M. et al., "Step and Repeat UV–Nanoimprint Lithography: Material Issues," Nanoimprint and Nanoprint Technology Conference, San Francisco, Dec. 11–13, 2002.

Johnson, et al., "Advances in Step and Flash Imprint Lithography," SPIE Microlithography Conference, Feb. 23–28, 2003.

Voisin, "Methods of Inspecting A Lithography Template," U.S. Appl. No. 10/293,919, filed Nov. 13, 2002.

Nimmakayala et al., "Magnification Correction Employing Out–of–Plane Distortion of a Substrate," U.S. Appl. No. 10/735,110, filed Dec. 12, 2003.

Sreenivasan et al., "A Conforming Template for Patterning Liquids Disposed On Substrates," U.S. Appl. No. 10/614,716, filed Jul. 7, 2003.

Communication Relating to the Results of the Partial International Search; International Appl. No. PCT/US2002/015551.

Abstract of Japanese Patent 63–138730.

Abstract of Japanese Patent 55–88332.

Abstract of Japanese Patent 57–7931.

Abstract of Japanese Patent 02–92603.

Translation of Japanese Patent 02–92603.

Abstract of Japanese Patent 02–24848.

Translation of Japanese Patent 02–24848.

Heidari et al., "Nanoimprint Lithography at the 6 in. Wafer Scale," Journal of Vacuum Science Technology, Nov./Dec. 2000, pp. 3557–3560, vol. B, No. 18(6)/.

Nerac.com Retro Search, "Reduction of Dimension of Contact Holes", Aug. 31, 2004.

Nerac.com Retro Search, "Trim Etching of Features Formed on an Organic Layer", Sep. 2, 2004.

Nerac.com Retro Search, "Multi–Layer Resists", Sep. 2, 2004.

Feynman, Richard P., "There's Plenty of Room at the Bottom—An Invitation to Enter a New Field of Physics," 12 pp onlineRetrieved Sep. 23, 2004 from URI:http://www.zyvex.com/nanotech/feynman.html.

White et al., "Holder, System, and Process for Improving Overlay in Lithography," U.S. Patent Application Publication 2003/0081193. Published on May 1, 2003.

* cited by examiner

CHUCKING SYSTEM FOR MODULATING SHAPES OF SUBSTRATES

The field of invention relates generally to lithography systems. More particularly, the present invention is directed to reducing undesirable pattern variations during imprint lithography processes.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique is dependent upon, inter alia, the composition of the polymerizable material.

U.S. Pat. No. 5,772,905 to Chou discloses a lithographic method and apparatus for creating ultra-fine (sub-36 nm) patterns in a thin film coated on a substrate in which a mold having at least one protruding feature is pressed into a thin film carried on a substrate. The protruding feature in the mold creates a recess in the thin film. The mold is removed from the film. The thin film then is processed such that the thin film in the recess is removed exposing the underlying substrate. Thus, patterns in the mold are replaced in the thin film, completing the lithography. The patterns in the thin film will be, in subsequent processes, reproduced in the substrate or in another material which is added onto the substrate.

Yet another imprint lithography technique is disclosed by Chou et al. in *Ultrafast and Direct Imprint of Nanostructures in Silicon*, Nature, Col. 417, pp. 835–837, June 2002, which is referred to as a laser assisted direct imprinting (LADI) process. In this process a region of a substrate is made flowable, e.g., liquefied, by heating the region with the laser. After the region has reached a desired viscosity, a mold, having a pattern thereon, is placed in contact with the region. The flowable region conforms to the profile of the pattern and is then cooled, solidifying the pattern into the substrate. An important consideration when forming patterns in this manner is to maintain control of the mold. In this fashion, undesirable variations in the pattern resulting from, inter alia, undesired deformation of the mold may be avoided. For example, in-plane distortion can cause line width variations, as well as pattern placement errors. Out-of-plane distortion can cause loss of focus in optical lithography resulting in varying the thickness of underlying residual layers. This may make difficult both line width control and etch transfer.

It is desired, therefore, to provide improved techniques for holding the mold so as to properly position the same with respect to the substrate upon which a pattern is to be formed.

SUMMARY OF THE INVENTION

The present invention is directed to a chucking system to modulate substrates so as to properly shape a mold and position the same with respect to a wafer upon which a pattern is formed using the mold. The chucking system includes a chuck body having first and second opposed sides with a side surface extending therebetween. The first side includes first and second spaced-apart recesses defining first and second spaced-apart support regions. The first support region cinctures the second support region and the first and second recesses. The second support region cinctures the second recess, with a portion of the body in superimposition with the second recess being transparent to radiation having a predetermined wavelength. The portion extends from the second side and terminates proximate to the second recess. The second side and the side surface define exterior surfaces. The body includes first and second throughways extending through the body placing the first and second recesses, respectively, in fluid communication with one of the exterior surfaces.

In another embodiment, a pressure control system is included. The first throughway places the first recess in fluid communication with the pressure control system and the second throughway places the pressure control system in fluid communication with the second recess. When mounted to the chuck body, the substrate rests against the first and second support regions, covering the first and second recesses. The first recess and the portion of the substrate in superimposition therewith define a first chamber and the second recess and the portion of the substrate in superimposition therewith defines a second chamber. The pressure control system operates to control a pressure in the first and second chambers. Specifically, the pressure is established in the first chamber to maintain the position of the substrate with the chuck body. The pressure in the second chamber may differ from the pressure in the first chamber to, inter alia, reduce distortions in the substrate that occur during imprinting. These and other embodiments of the present invention are discussed more fully below.

DETAILED DESCRIPTION OF THE INVENTION

Figure 1:
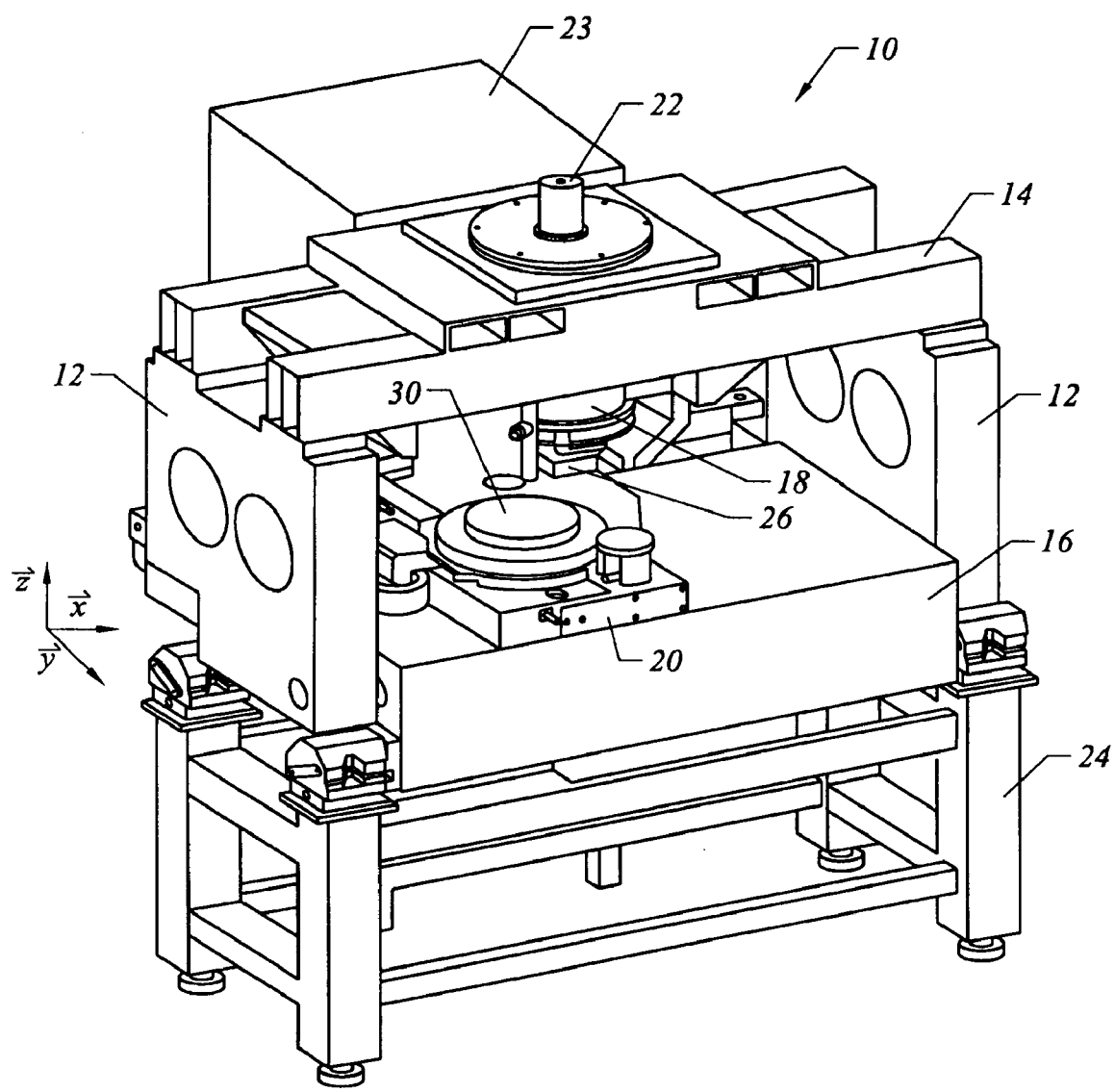
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes. A radiation source 22 is coupled to system 10 to impinge actinic radiation upon motion stage 20. As shown, radiation source 22 is coupled to bridge 14 and includes a power generator 23 connected to radiation source 22.

Figure 2:
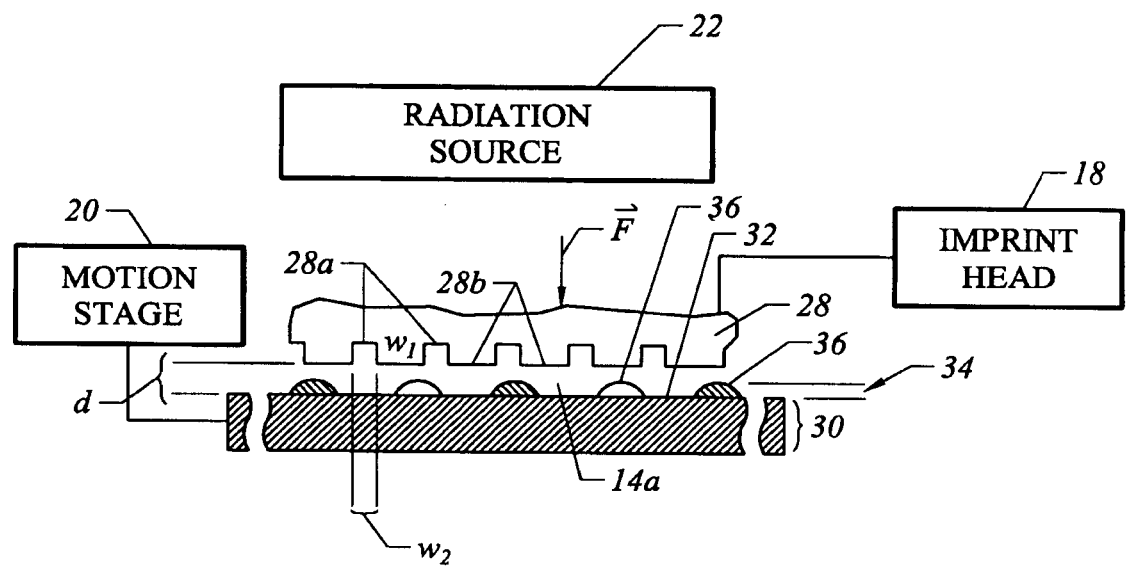
FIG. 2 is a simplified elevation view of a lithographic system shown in FIG. 1.

Referring to both FIGS. 1 and 2, connected to imprint head 18 is a substrate 26 having a mold 28 thereon. Mold 28 includes a plurality of features defined by a plurality of spaced-apart recessions 28a and protrusions 28b. The plurality of features defines an original pattern that is to be transferred into a wafer 30 positioned on motion stage 20. To that end, imprint head 18 is adapted to move along the Z axis and vary a distance "d" between mold 28 and wafer 30. In this manner, the features on mold 28 may be imprinted into a flowable region of wafer 30, discussed more fully below. Radiation source 22 is located so that mold 28 is positioned between radiation source 22 and wafer 30. As a result, mold 28 is fabricated from material that allows it to be substantially transparent to the radiation produced by radiation source 22.

Figure 3:
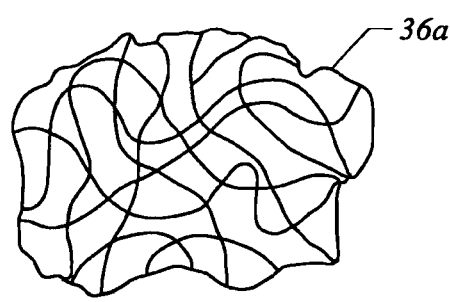
FIG. 3 is a simplified representation of material from which an imprinting layer, shown in FIG. 2, is comprised before being polymerized and cross-linked.

Referring to both FIGS. 2 and 3, a flowable region, such as an imprinting layer 34, is disposed on a portion of surface 32 that presents a substantially planar profile. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et. al. in *Ultrafast and Direct Imprint of Nanostructures in Silicon*, Nature, Col. 417, pp. 835–837, June 2002. In the present embodiment, however, the flowable region consists of imprinting layer 34 being deposited as a plurality of spaced-apart discrete beads 36 of material 36a on wafer 30, discussed more fully below. Imprinting layer 34 is formed from a material 36a that may be selectively polymerized and cross-linked to record the original pattern therein, defining a recorded pattern. Material 36a is shown in FIG. 4 as being cross-linked at points 36b, forming cross-linked polymer material 36c.

Figure 5:
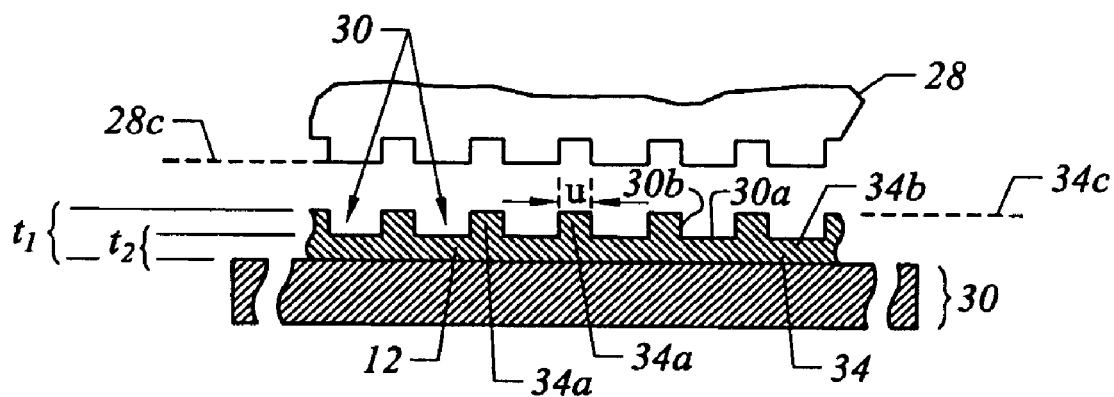
FIG. 5 is a simplified elevation view of a mold spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, imprint head 18 reduces the distance "d" to allow imprinting layer 34 to come into mechanical contact with mold 28, spreading beads 36 so as to form imprinting layer 34 with a contiguous formation of material 36a over surface 32. In one embodiment, distance "d" is reduced to allow sub-portions 34a of imprinting layer 34 to ingress into and fill recessions 28a.

To facilitate filling of recessions 28a, material 36a is provided with the requisite properties to completely fill recessions 28a while covering surface 32 with a contiguous formation of material 36a. In the present embodiment, sub-portions 34b of imprinting layer 34 in superimposition with protrusions 28b remain after the desired, usually minimum distance "d", has been reached, leaving sub-portions 34a with a thickness $t_1$, and sub-portions 34b with a thickness, $t_2$. Thicknesses "$t_1$" and "$t_2$" may be any thickness desired, dependent upon the application. Typically, $t_1$ is selected so as to be no greater than twice the width u of sub-portions 34a, i.e., $t_1 \leq 2u$, shown more clearly in FIG. 5.

Figure 4:
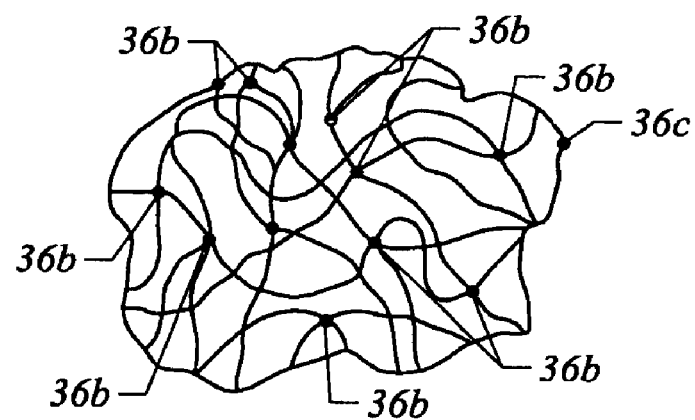
FIG. 4 is a simplified representation of crosslinked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links material 36a, forming cross-linked polymer material 36c. As a result, the composition of imprinting layer 34 transforms from material 36a to material 36c, which is a solid. Specifically, material 36c is solidified to provide side 34c of imprinting layer 34 with a shape conforming to a shape of a surface 28c of mold 28, shown more clearly in FIG. 5. After imprinting layer 34 is transformed to consist of material 36c, shown in FIG. 4, imprint head 18, shown in FIG. 2, is moved to increase distance "d" so that mold 28 and imprinting layer 34 are spaced-apart.

Figure 6:
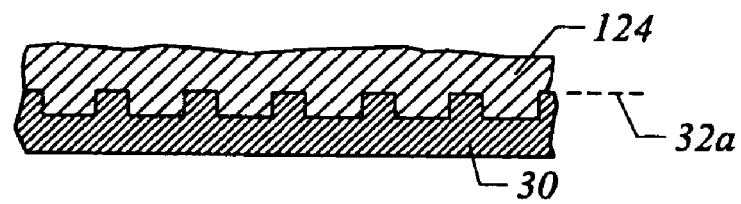
FIG. 6 is a simplified elevation view of an additional imprinting layer positioned atop of the substrate shown in FIG. 5 after the pattern in the first imprinting layer is transferred therein.

Referring to FIG. 5, additional processing may be employed to complete the patterning of wafer 30. For example, wafer 30 and imprinting layer 34 may be etched to transfer the pattern of imprinting layer 34 into wafer 30, providing a patterned surface 32a, shown in FIG. 6. To facilitate etching, the material from which imprinting layer 34 is formed may be varied to define a relative etch rate with respect to wafer 30, as desired. The relative etch rate of imprinting layer 34 to wafer 30 may be in a range of about 1.5:1 to about 100:1. Alternatively, or in addition to, imprinting layer 34 may be provided with an etch differential with respect to photo-resist material (not shown) selectively disposed thereon. The photo-resist material (not shown) may be provided to further pattern imprinting layer 34, using known techniques. Any etch process may be employed, dependent upon the etch rate desired and the underlying constituents that form wafer 30 and imprinting layer 34. Exemplary etch processes may include plasma etching, reactive ion etching, chemical wet etching and the like.

Referring to both FIGS. 1 and 2 an exemplary radiation source 22 may produce ultraviolet radiation. Other radiation sources may be employed, such as thermal, electromagnetic and the like. The selection of radiation employed to initiate the polymerization of the material in imprinting layer 34 is known to one skilled in the art and typically depends on the specific application which is desired. Furthermore, the plurality of features on mold 28 are shown as recessions 28a extending along a direction parallel to protrusions 28b that provide a cross-section of mold 28 with a shape of a battlement. However, recessions 28a and protrusions 28b may correspond to virtually any feature required to create an integrated circuit and may be as small as a few tenths of nanometers. As a result, it may be desired to manufacture components of system 10 from materials that are thermally stable, e.g., have a thermal expansion coefficient of less than about 10 ppm/degree centigrade at about room temperature (e.g. 25 degrees Centigrade). In some embodiments, the material of construction may have a thermal expansion coefficient of less than about 10 ppm/degree Centigrade, or less than 1 ppm/degree Centigrade. To that end, bridge supports 12, bridge 14, and/or stage support 16 may be fabricated from one or more of the following materials: silicon carbide, iron alloys available under the trade name INVAR®, or name SUPER INVAR™, ceramics, including but not limited to ZERODUR® ceramic. Additionally table 24 may be constructed to isolate the remaining components of system 10 from vibrations in the surrounding environment. An exemplary table 24 is available from Newport Corporation of Irvine, Calif.

Figure 7:
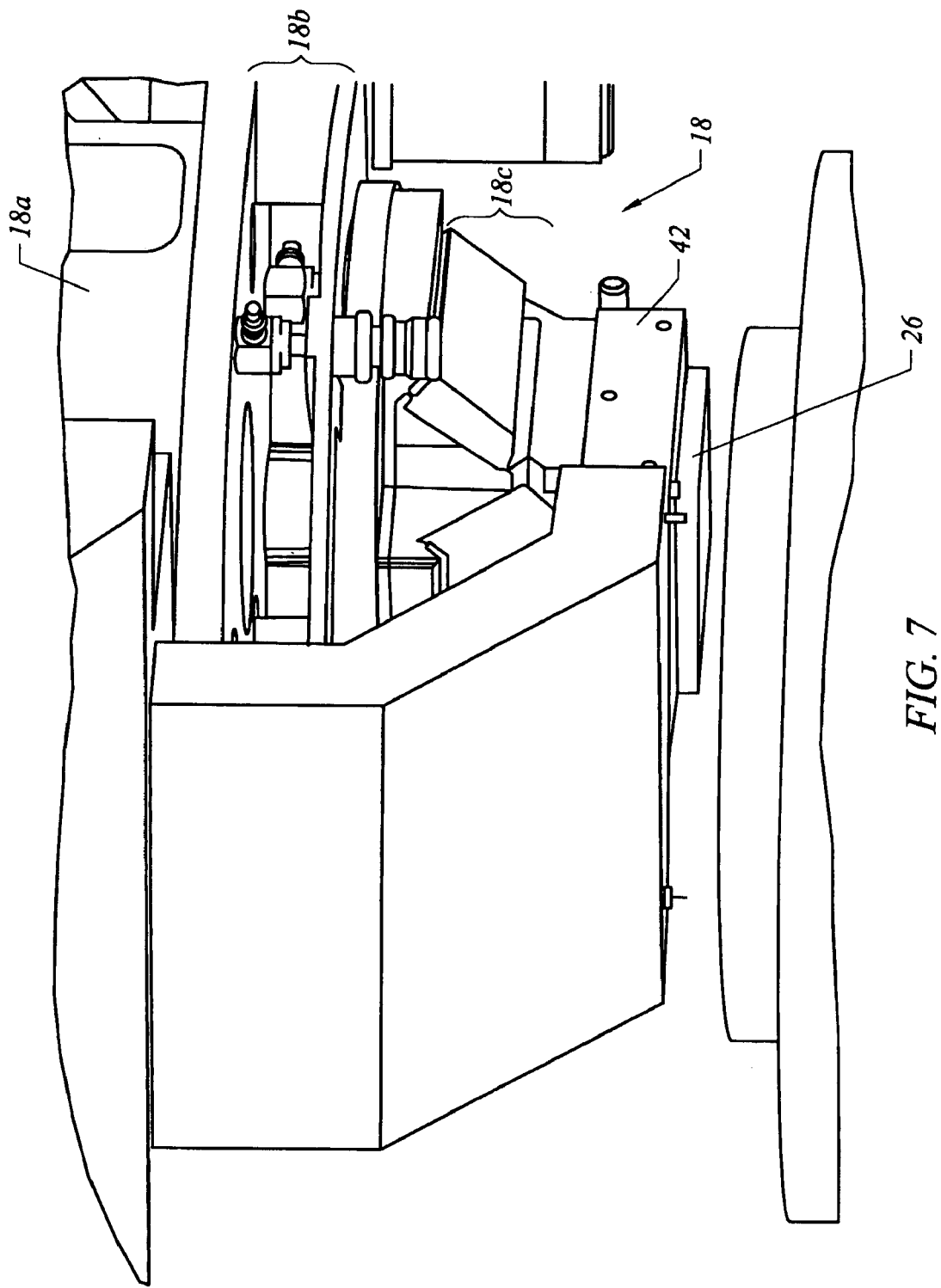
FIG. 7 is a detailed perspective view of a print head shown in FIG. 1.
Figure 8:
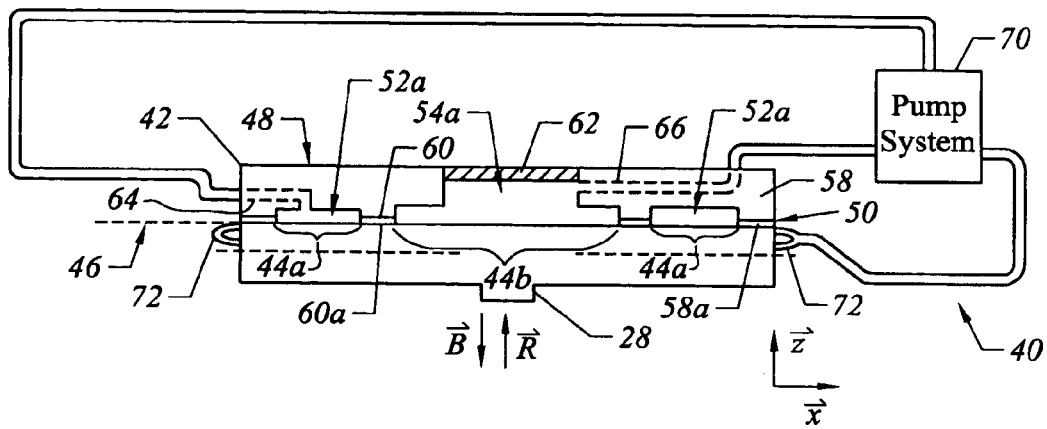
FIG. 8 is a cross-sectional view of a chucking system in accordance with the present invention.

Referring to FIGS. 7 and 8, substrate 26, upon which mold 28 is present, is coupled to imprint head housing 18a via a chucking system 40 that includes chuck body 42. Specifically, a calibration system 18b is coupled to imprint head housing 18a, and chuck body 42 couples substrate 26 to calibration system 18b vis-à-vis a flexure system 18c. Calibration system 18b facilitates proper orientation alignment between substrate 26 and wafer 30, shown in FIG. 5, thereby achieving a substantially uniform gap distance ,"d", therebetween.

Figure 9:
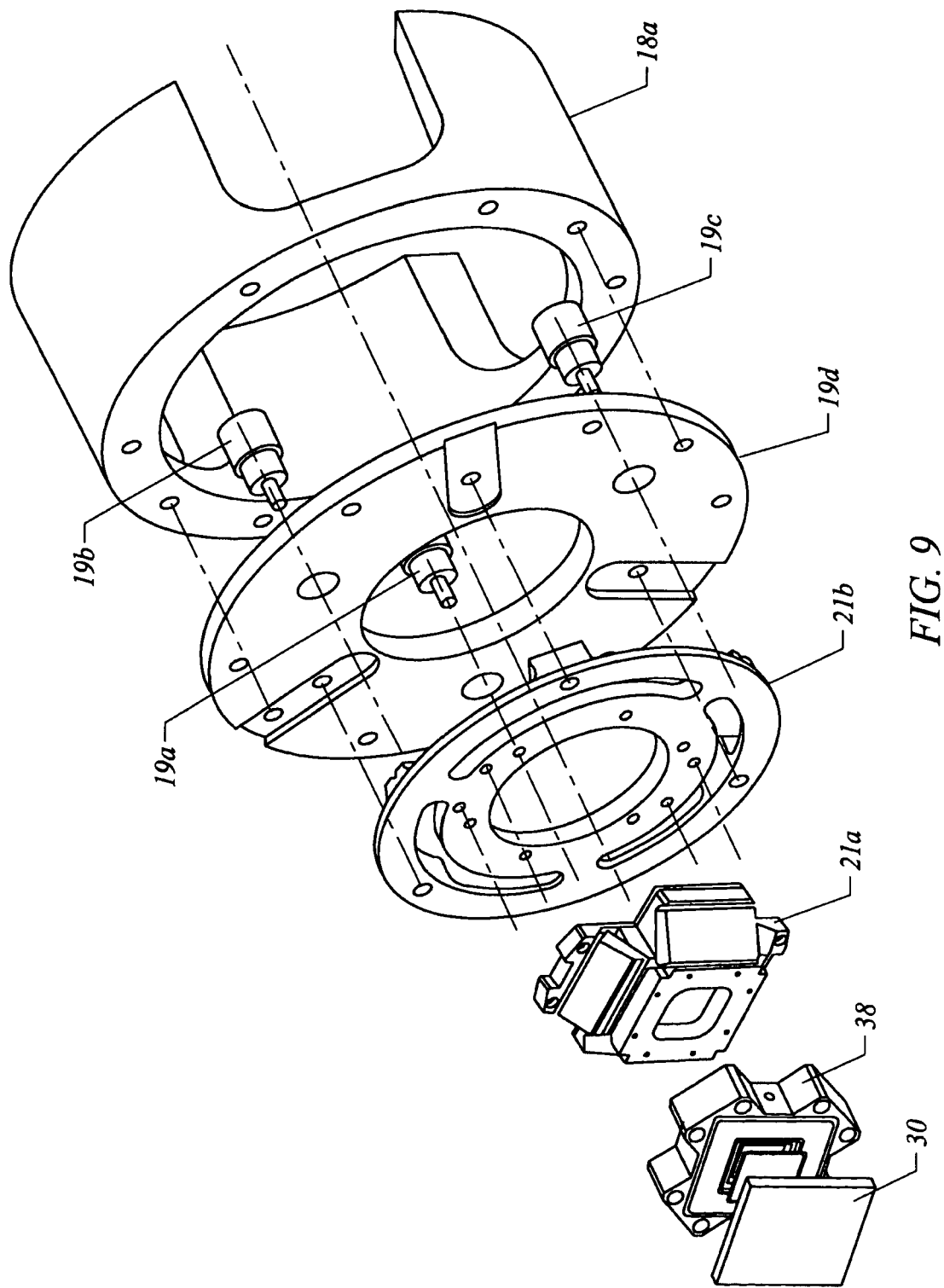
FIG. 9 is an exploded view of an imprint head shown in FIG. 7.

Referring to both FIGS. 7 and 9, calibration system 18b includes a plurality of actuators 19a, 19b and 19c and a base plate 19d. Specifically, actuators 19a, 19b and 19c are connected between housing 18a and base plate 19d. Flexure system 18c includes flexure springs 21a and flexure ring 21b. Flexure ring 21b is coupled between base plate 19d and flexure springs 21a. Motion of actuators 19a, 19b and 19c orientates flexure ring 21b that may allow for a coarse calibration of flexure springs 21a and, therefore, chuck body 42 and substrate 26. Actuators 19a, 19b and 19c also facilitate translation of flexure ring 21b to the Z-axis. Flexure springs 21a include a plurality of linear springs that facilitate gimbal-like motion in the X-Y plane so that proper orientation alignment may be achieved between wafer 30 and substrate 26, shown in FIG. 2.

Figure 10:
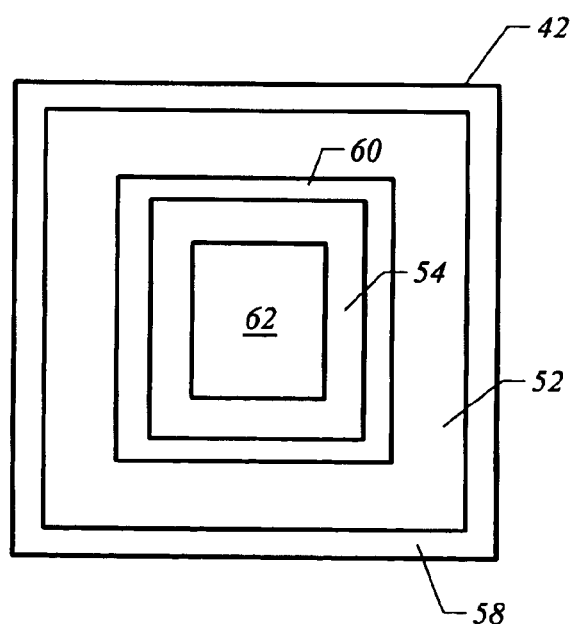
FIG. 10 is a bottom-up plan view of a chuck body shown in FIG. 8.

Referring to FIGS. 8 and 10 chuck body 42 is adapted to retain substrate 26 upon which mold 28 is attached employing vacuum techniques. To that end, chuck body 42 includes first 46 and second 48 opposed sides. A side, or edge, surface 50 extends between first side 46 and second side 48. First side 46 includes a first recess 52 and a second recess 54, spaced-apart from first recess 52, defining first 58 and second 60 spaced-apart support regions. First support region 58 cinctures second support region 60 and the first 52 and second 54 recesses. Second support region 60 cinctures second recess 54. A portion 62 of chuck body 42 in superimposition with second recess 54 is transparent to radiation having a predetermined wavelength, such as the wavelength of the actinic radiation mentioned above. To that end, portion 62 is made from a thin layer of transparent material, such as glass. However, the material from which portion 62 is made may depend upon the wavelength of radiation produced by radiation source 22, shown in FIG. 2. Portion 62 extends from second side 48 and terminates proximate to second recess 54 and should define an area at least as large as an area of mold 28 so that mold 28 is in superimposition therewith. Formed in chuck body 42 are one or more throughways, shown as 64 and 66. One of the throughways, such as throughway 64 places first recess 52 in fluid communication with side surface 50. The remaining throughway, such as throughway 66, places second recess 54 in fluid communication with side surface 50.

It should be understood that throughway 64 may extend between second side 48 and first recess 52, as well. Similarly, throughway 66 may extend between second side 48 and second recess 54. What is desired is that throughways 64 and 66 facilitate placing recesses 52 and 54, respectively, in fluid communication with a pressure control system, such a pump system 70.

Pump system 70 may include one or more pumps to control the pressure proximate to recesses 52 and 54, independently of one another. Specifically, when mounted to chuck body 42, substrate 26 rests against first 58 and second 60 support regions, covering first 52 and second 54 recesses. First recess 52 and a portion 44a of substrate 26 in superimposition therewith define a first chamber 52a. Second recess 54 and a portion 44b of substrate 26 in superimposition therewith define a second chamber 54a. Pump system 70 operates to control a pressure in first 52a and second 54a chambers. Specifically, the pressure is established in first chamber 52a to maintain the position of the substrate 26 with the chuck body 42 and reduce, if not avoid, separation of substrate 26 from chuck body 42 under force of gravity. The pressure in the second chamber 54a may differ from the pressure in the first chamber 52a to, inter alia, reduce distortions in the substrate 26 that occur during imprinting, by modulating a shape of substrate 26. For example, pump system 70 may apply a positive pressure in chamber 54a to compensate for any upward force R that occurs as a result on imprinting layer 34 contacting mold 28. In this manner, produced is a pressure differential between differing regions of side 46 so that bowing of substrate 26 and, therefore, mold 28 under force R is attenuated, if not avoided.

Coupled to substrate 26 is a means to compress the same in X and Y directions, with the understanding that the Y-direction is into the plane of FIG. 8. In the present example the means to compress includes a fluid-tight bladder 72 surrounding substrate 26; however, any device may be employed to that end, for example, a vice. Bladder 72 is in fluid communication with pump system 70 to control the fluid pressure in bladder 72. In this manner, bladder 72 may be used to apply a force to substrate 26 to vary the dimensions of the same and reduce distortions in the pattern recorded into imprinting layer 34, shown in FIG. 2.

Specifically, distortions in the pattern recorded into imprinting layer 34 may arise from, inter alia, dimensional variations of imprinting layer 34 and wafer 30. These dimensional variations, which may be due in part to thermal fluctuations, as well as, inaccuracies in previous processing steps that produce what is commonly referred to as magnification/run-out errors. The magnification/run-out errors occur when a region of wafer 30 in which the original pattern is to be recorded exceeds the area of the original pattern. Additionally, magnification/run-out errors may occur when the region of wafer 30, in which the original pattern is to be recorded, has an area smaller than the original pattern. The deleterious effects of magnification/run-out errors are exacerbated when forming multiple layers of imprinted patterns, shown as imprinting layer 124 in superimposition with patterned surface 32a, shown in FIG. 6. Proper alignment between two superimposed patterns is difficult in the face of magnification/run-out errors in both single-step full wafer imprinting and step-and-repeat imprinting processes.

Figure 11:
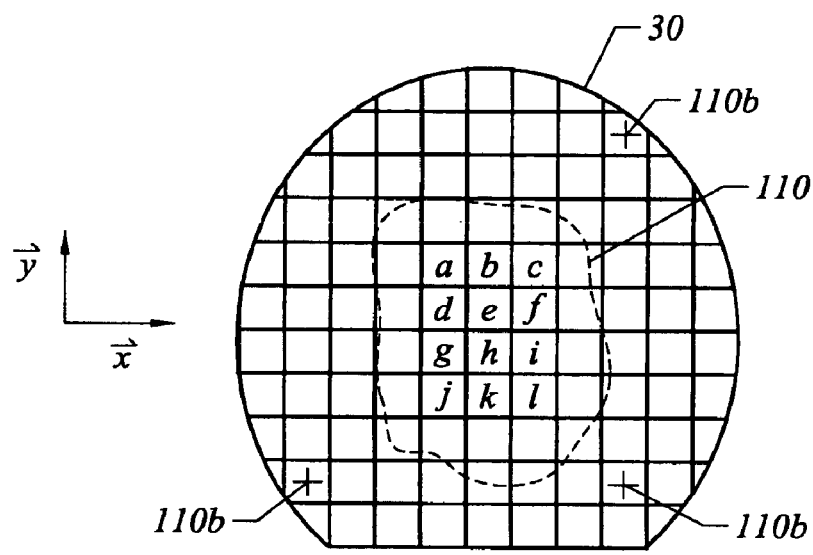
FIG. 11 is a top down view of a wafer, shown in FIGS. 2, 5 and 6 upon which imprinting layers are disposed.
Figure 12:
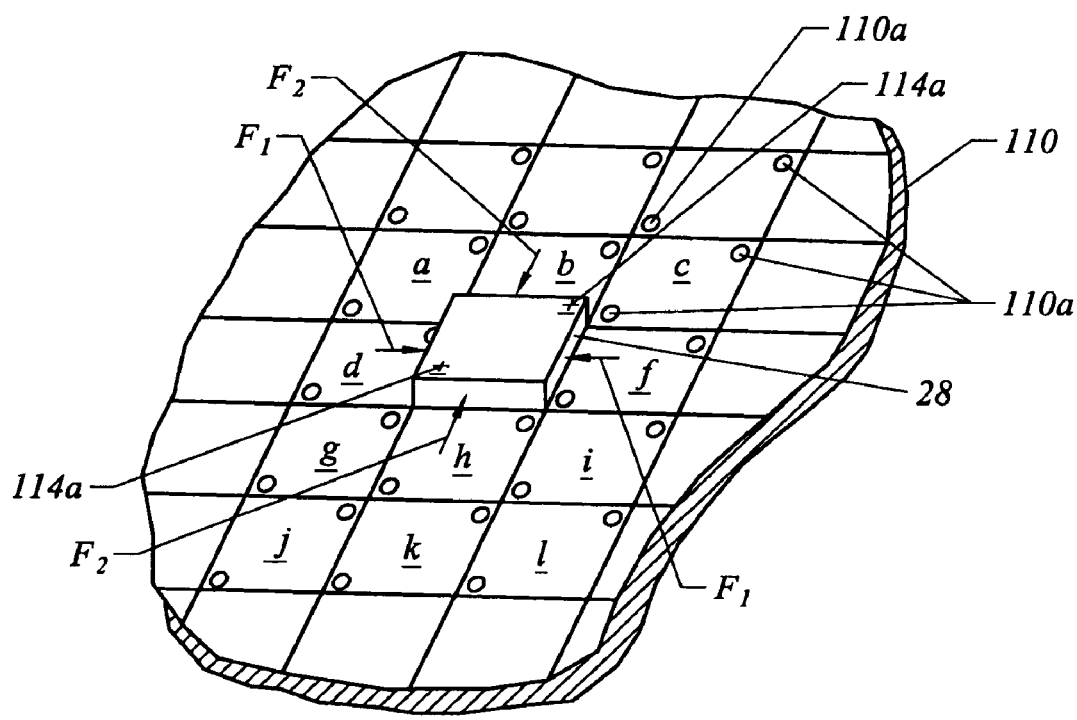
FIG. 12 is a detailed view of FIG. 11 showing the position of the mold in one of the imprint regions.

Referring to FIGS. 11 and 12, a step-and-repeat process includes defining a plurality of regions, shown as, a–l, on wafer 30 in which the original pattern on mold 28 will be recorded. The original pattern on mold 28 may be coextensive with the entire surface of mold 28, or simply located to a sub-portion thereof. The present invention will be discussed with respect to the original pattern being coextensive with the surface of mold 28 that faces wafer 30. Proper execution of a step-and-repeat process may include proper alignment of mold 28 with each of regions a–l. To that end, mold 28 includes alignment marks 114a, shown as a "+" sign. One or more of regions a–l includes fiducial marks 110a. By ensuring that alignment marks 114a are properly aligned with fiducial marks 110a, proper alignment of mold 28 with one of regions a–l in superimposition therewith is ensured. To that end, machine vision devices (not shown) may be employed to sense the relative alignment between alignment marks 114a and fiducial marks 110a. In the present example, proper alignment is indicated upon alignment marks 114a being in superimposition with fiducial marks 110a. With the introduction of magnification/run-out errors, proper alignment becomes very difficult.

However, in accordance with one embodiment of the present invention, magnification/run-out errors are reduced, if not avoided, by creating relative dimensional variations between mold 28 and wafer 30. Specifically, the temperature of wafer 30 is varied so that one of regions a–l defines an area that is slightly less than an area of the original pattern on mold 28. Thereafter, the final compensation for magnification/run-out errors is achieved by subjecting substrate 26, shown in FIG. 8, to mechanical compression forces using bladder 72, which are in turn transferred to mold 28 shown by arrows $F_1$ and $F_2$, orientated transversely to one another, shown in FIG. 12. In this manner, the area of the original pattern is made coextensive with the area of the region a–l in superimposition therewith.

Referring to both FIGS. 5 and 8, subjecting substrate 26 to compressive forces, however, modulates the shape of the same through bending action. Bending of substrate 26 may also introduce distortions in the pattern imprinted into imprinting layer 34. The pattern distortions attributable to bending of substrate 26 may be reduced, if not prevented, by positioning bladder 72 so that the bending of substrate 26 is controlled to occur in a desired direction. In the present example, bladder 72 is positioned to compress substrate 26 so as to bow in a direction parallel to, and opposite of, force R. By controlling the bending of substrate 26 in this manner, chucking system 40 may be employed to counter the bending force, B, so as to establish mold 28 to be a desired shape, e.g., arcuate, planar and the like. Pump system 70 may be employed to pressurize chamber 54a appropriately to that end. For example, assuming bending force, B, is greater than force R, pump system 70 would be employed to evacuate chamber 54a with sufficient vacuum to counter the bending force B. Were bending force B weaker than force, R, pump system 70 would be employed to pressurize chamber 54a appropriately to maintain planarity of mold 28, or any other desired shape. The exact pressure levels may be determined with a priori knowledge of the forces R and B which then may be analyzed by a processor (not shown) that may be included in pump system 70 to pressurize chambers 52a and 54a to the appropriate levels. Also, the forces R and B may be sensed dynamically using known techniques so that the pressure within chambers 52a and 54a may be established dynamically during operation to maintain substrate 26 with a desired shape. An added benefit is that the pressure in one or both chambers 52a and 54a may be established to be a positive pressure, thereby facilitating removal of substrate 26 from chuck body 42. This also may be accomplished under processor control, or manually.

Referring again to FIG. 8, when compressing substrate 26 with bladder 72, relative movement between substrate 26 and support regions 58 and 60 occurs along the X and Y axes. As a result, it is desired that support regions 58 and 60 have surface regions 58a and 60a, respectively, formed thereon from a material adapted to conform to a profile of substrate 26 and resistant to deformation along the X and Y axes. In this manner, surface regions 58a and 60a resist relative movement of substrate 26 with respect to chuck body 42 in the X and Y directions.

Figure 13:
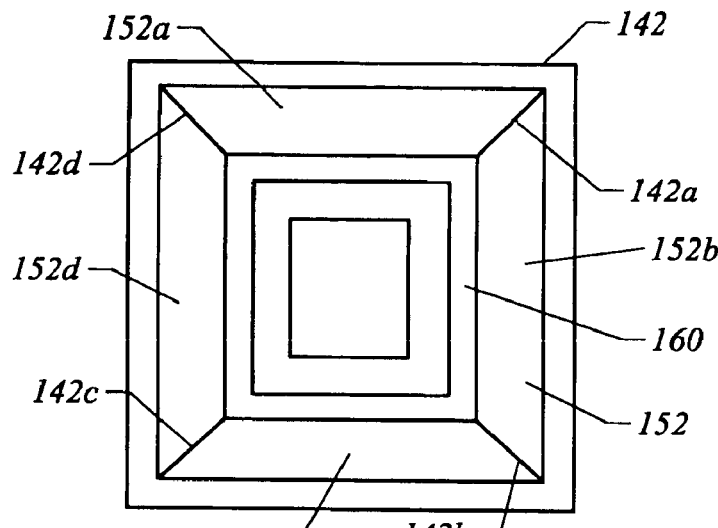
FIG. 13 is a bottom-up plan view of the chuck body shown in FIG. 8 in accordance with an alternate embodiment.

Referring to FIGS. 8 and 13, in another embodiment, chuck body 142 may include one or more walls, or baffles, shown as 142a, 142b, 142c and 142d extending between first and second support regions 158 and 160. In this fashion, walls/baffles 142a, 142b, 142c and 142d segment recess 152 into a plurality of sub-regions 152a, 152b, 152c and 152d that function as sub-chambers once substrate 26 is placed in superimposition therewith. Sub-chambers 152a, 152b, 152c and 152d may be fluid-tight which would result in each have a throughway (not shown) placing the same in fluid communication with pump system 70. Alternatively, or in conjunction therewith, sub-chambers 152a, 152b, 152c and 152d may not form fluid-tight chambers once substrate 26 is placed in superimposition therewith. Rather walls 142a, 142b, 142c and 142d would be spaced apart from substrate 26 to function as a baffle for fluid transfer across the same. As a result, with the appropriate pressure level being provided by pump system 70 to recess 152, a pressure differential could be provided between sub-chambers 152a, 152b, 152c and 152d, as desired.

Referring to both FIGS. 2 and 13, providing walls/baffles 142a, 142b, 142c and 142d this configuration, sub-regions 152a, 152b, 152c and 152d may be concurrently provided with differing pressure levels. As a result, the amount of force exerted on substrate 26 when being pulled-apart from imprinting layer 34 may vary across the surface of substrate 26. This allows cantilevering, or peeling-off of substrate 26 from imprinting layer 34 that reduces distortions or defects from being formed in imprinting layer 34 during separation of substrate 26 therefrom. For example, sub-chamber 152b may have a pressure established therein that is greater than the pressure associated with the remaining sub-chambers 152a, 152c and 152d. As a result, when increasing distance "d" the pulling force of the portion of substrate 26 in superimposition with sub-chambers 152a, 152c and 152d is subjected to is greater than the pulling force to which the portion of substrate 26 in superimposition with sub-chamber 152b is subjected. Thus, the rate that "d" increases for the portion of substrate 26 in superimposition with sub-chambers 152a, 152c and 152d is accelerated compared to the rate at which "d" increases for the portion of substrate 26 in superimposition with sub-chamber 152b, providing the aforementioned cantilevering effect.

Figure 14:
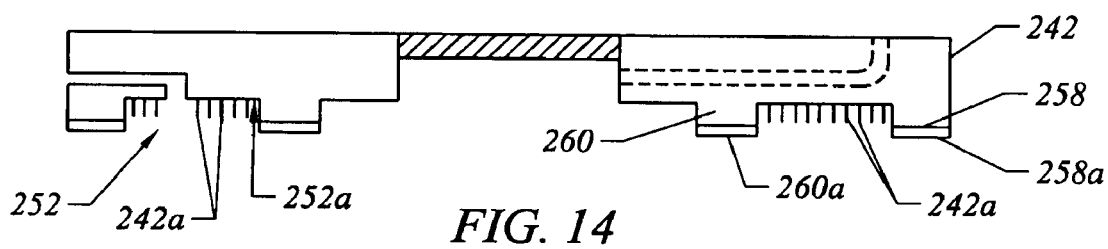
FIG. 14 is a cross-sectional view of a chuck body shown in FIG. 8 in accordance with a second alternate embodiment.

In yet another embodiment, shown in FIG. 14, chuck body 242 includes a plurality of pins 242a projecting from a nadir surface 252a of out recess 252. Pins 242a provide mechanical support for the wafer (not shown) retained on chuck body 242 via vacuum. This enables support regions 258 and 260 to have surface regions 258a and 260a, respectively, formed from material that is fully compliant with the surface (not shown) of the wafer (not shown) resting against support regions 258 and 260. In this manner, surface regions 258a and 260a provide a fluid-tight seal with the wafer (not shown) in the presence of extreme surface variation, e.g., when particulate matter is present between the surface (not shown) of the wafer (not shown) and the surface regions 258a and 260a. Mechanical support of the wafer (not shown) in the Z direction need not be provided by surface regions 258a and 260a. Pins 242a provide this support. To that end, pins 242a are typically rigid posts having a circular cross-section.

Figure 15:
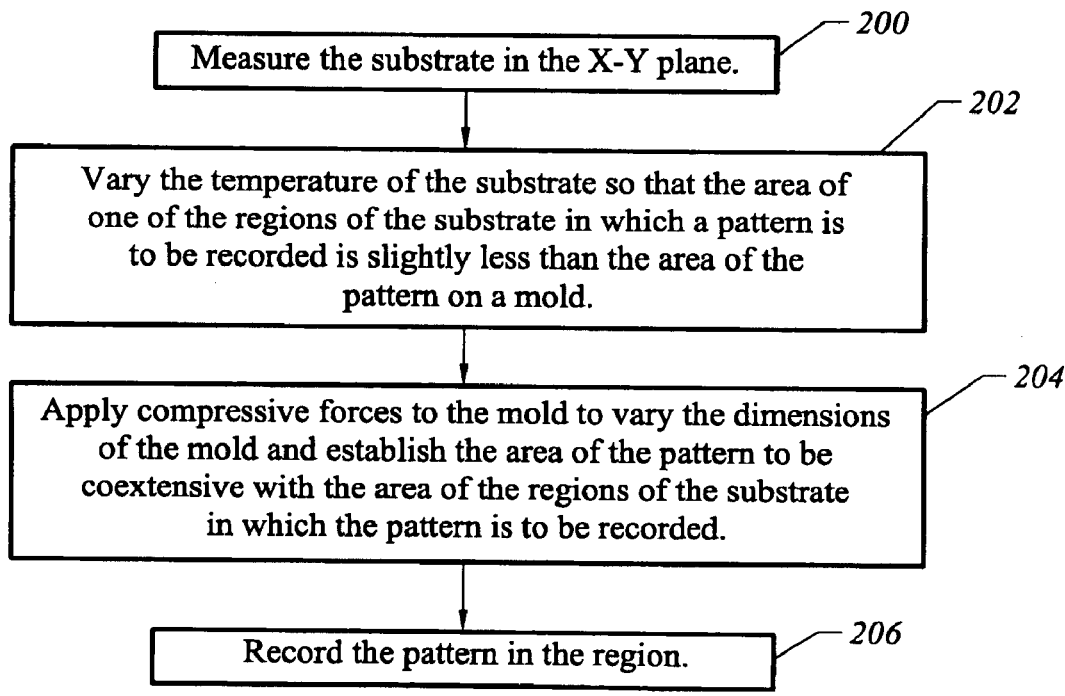
FIG. 15 is a flow diagram showing a method of reducing distortions in patterns formed using imprint lithography techniques in accordance with the present invention.

Referring to FIGS. 11, 12 and 15, in operation, an accurate measurement of wafer 30 in an X-Y plane is undertaken at step 200. This may be achieved by sensing gross alignment fiducials 110b present on wafer 30 using machine vision devices (not shown) and known signal processing techniques. At step 202, the temperature of wafer 30 may be varied, i.e., raised or lowered, so that the area of one of regions a–l is slightly less than an area of the original pattern on mold 28. The temperature variations may be achieved using a temperature controlled chuck or pedestal (not shown) against which wafer 30 rests. The area of each of regions a–l can be determined by measurement of a change in distance between two collinear gross alignment fiducials 110b.

Specifically, a change in the distance between two gross alignment fiducials 110b collinear along one of the X or Y axes is determined. Thereafter, this change in distance is divided by a number of adjacent regions a–l on the wafer 30 along the X-axis. This provides the dimensional change of the areas of regions a–l attributable to dimensional changes in wafer 30 along the X-axis. If necessary the same measurement may be made to determine the change in area of regions a–l due to dimensional changes of wafer 30 along the Y-axis. However, it may also be assumed that the dimensional changes in wafer 30 may be uniform in the two orthogonal axes, X and Y.

At step 204, compressive forces, $F_1$ and $F_2$, are applied to mold 28 to establish the area of the original pattern to be coextensive with the area of one of the regions a–l in superimposition with the pattern. This may be achieved in real-time employing machine vision devices (not shown) and known signal processing techniques, to determine when two or more of alignment marks 114a are aligned with two or more of fiducial marks 110a. At step 206, after proper alignment is achieved and magnification/run-out errors are reduced, if not vitiated, the original pattern is recorded in the region a–l that is in superimposition with mold 28, forming the recorded pattern. It is not necessary that compression forces $F_1$ and $F_2$ have the same magnitude, as the dimensional variations in either wafer 30 or mold 28 may not be uniform in all directions. Further, the magnification/run-out errors may not be identical in both X-Y directions. As a result, compression forces, $F_1$ and $F_2$ may differ to compensate for these anomalies. Furthermore, to ensure greater reduction in magnification/run-out errors, the dimensional variation in mold 28 may be undertaken after mold 28 contacts imprinting layer 124, shown in FIG. 6. However, this is not necessary.

Referring again to FIGS. 6, 11 and 12, the alignment of mold 28 with regions a–l in superimposition therewith may occur with mold 28 being spaced-apart from imprinting layer 124. Were it found that the magnification/run-out errors were constant over the entire wafer 30, then the magnitude of forces $F_1$ and $F_2$ could be maintained for each region a–l in which the original pattern is recorded. However, were it determined that the magnification/run-out errors differed for one or more regions a–l, steps 202 and 204, shown in FIG. 15, would then be undertaken for each region a–l in which the original pattern is recorded. It should be noted that there are limits to the relative dimensional changes that may occur between wafer 30 and mold 28. For example, the area of the regions a–l should be of appropriate dimensions to enable pattern on mold 28 to define an area coextensive therewith when mold 28 is subject to compression forces $F_1$ and $F_2$, without compromising the structural integrity of mold 28.

Figure 16:
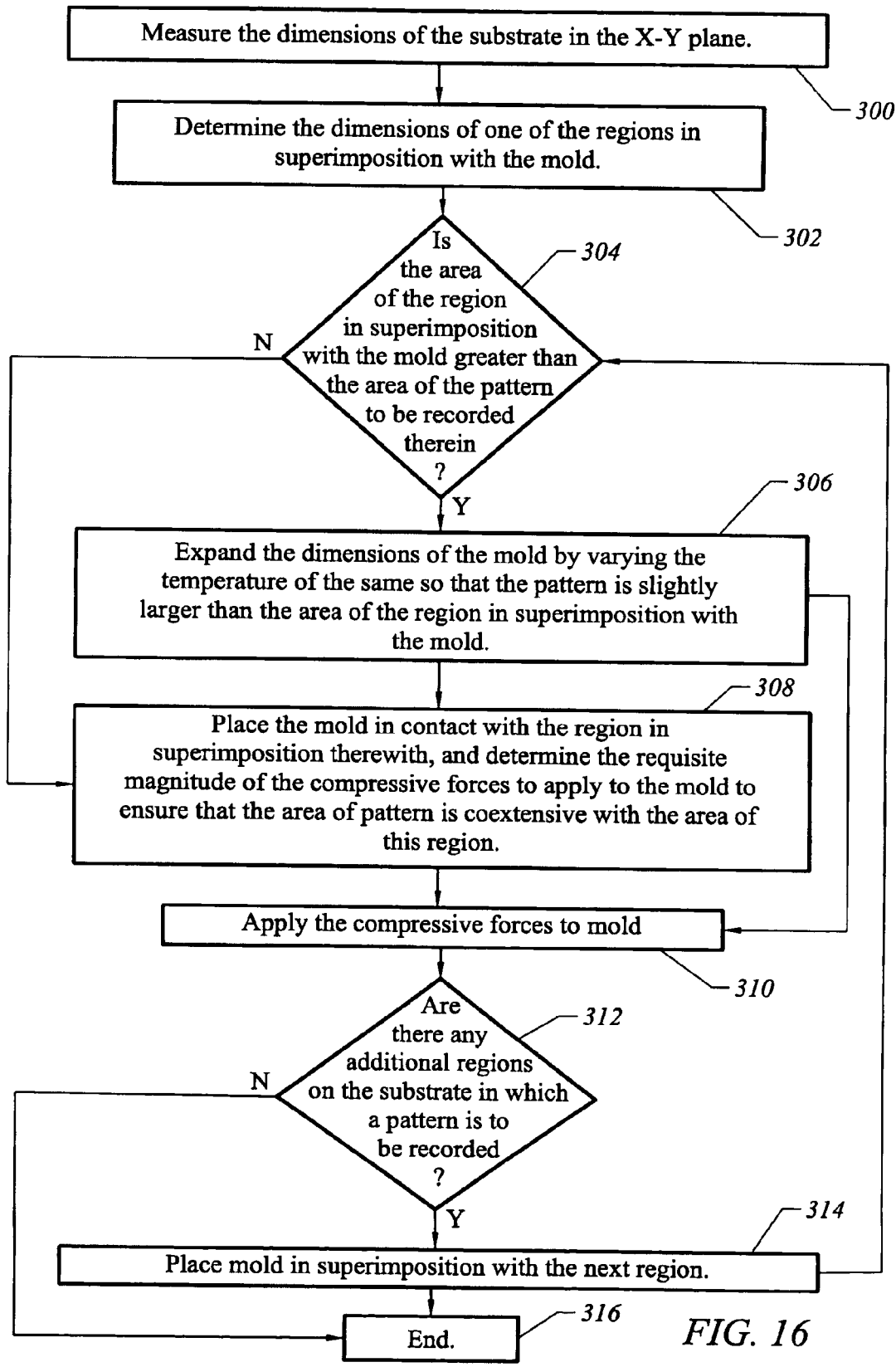
FIG. 16 is a flow diagram showing a method of reducing distortions in patterns formed using imprint lithography techniques in accordance with an alternate embodiment of the present invention.

Referring to FIGS. 5 and 16, in accordance with another embodiment of the present invention, accurate measurement of wafer 30 in an X-Y plane is undertaken at step 300. At step 302, the dimensions of one of regions a–l in superimposition with mold 28 is determined. At step 304 it is determined whether the area of one of regions a–l in superimposition with mold 28 is larger than the area of the pattern on mold 28. If this is the case, the process proceeds to step 306, otherwise the process proceeds to step 308. At step 308, mold 28 is placed in contact with the region a–l in superimposition therewith, and the requisite magnitude of compressive forces $F_1$ and $F_2$ is determined to apply to mold 28 to ensure that the area of pattern is coextensive with the area of this region a–l. At step 310, compressive forces $F_1$ and $F_2$ are applied to mold 28. Thereafter, mold 28 is spaced-apart from the region a–l in superimposition with mold 28 and the process proceeds to step 312 where it is determined whether there remain any regions a–l on wafer 30 in which to record the original pattern. If there are, the process proceeds to step 314 wherein mold is placed in superimposition with the next region and the process proceeds to step 304. Otherwise, the process ends at step 316.

Were it determined at step 304 that the region a–l in superimposition with mold 28 had an area greater than the area of the pattern, then the process proceeds to step 306 wherein the temperature of mold 28 is varied to cause expansion of the same. In the present embodiment, mold 28 is heated at step 306 so that the pattern is slightly larger than the area of region a–l in superimposition therewith. Then the process continues at step 310.

The embodiments of the present invention described above are exemplary. Many changes and modifications may be made to the disclosure recited above, while remaining within the scope of the invention. For example, by pressurizing all chambers formed by the chuck body-substrate combination with positive fluid pressure, the substrate may be quickly released from the chuck body. Further, many of the embodiments discussed above may be implemented in existing imprint lithography processes that do not employ formation of an imprinting layer by deposition of beads of polymerizable material. Exemplary processes in which differing embodiments of the present invention may be employed include a hot embossing process disclosed in U.S. Pat. No. 5,772,905, which is incorporated by reference in its entirety herein. Additionally, many of the embodiments of the present invention may be employed using a laser assisted direct imprinting (LADI) process of the-type described by Chou et al. in *Ultrafast and Direct Imprint of Nanostructures in Silicon*, Nature, Col. 417, pp. 835–837, June 2002. Therefore, the scope of the invention should be determined not with reference to the above description, but instead should be determined with reference to the appended claims along with their full scope of equivalents.

What is claimed is:

1. A chucking system to hold a substrate, said chucking system comprising:

a chuck body having first and second opposed sides with an edge surface extending therebetween, said first side including first and second spaced-apart recesses defining first and second spaced-apart support regions, with said first support region cincturing said second support region and said first and second recesses, and said second support region cincturing said second recess, with a portion of said body in superimposition with said second recess being transparent to radiation having a predetermined wavelength, said portion extending from said second side and terminating proximate to said second recess, said second side and said edge surface defining exterior surfaces, with said body including a throughway extending through said body placing one of said first and second recesses in fluid communication with one of said exterior surfaces.

2. The chucking system as recited in claim 1 wherein each of said first and second support regions has a support surface associated therewith, facing away from said second side, with said support surface being formed from a material adapted to conform to a profile of said substrate.

3. The chucking system as recited in claim 1 wherein said first recess includes a plurality of spaced-apart pins extending therefrom.

4. The chucking system as recited in claim 1 wherein each of said first and second support regions has a support surface associated therewith, facing away from said second side, with said support surface being formed from a material compliant in a first direction extending between said first and second opposed sides to conform to a profile of said substrate while being resistant to movement in a direction transverse to said first direction.

5. The chucking system as recited in claim 1 further including a wall disposed within said second recess, extending between said first and second support regions to segment said first recess into a plurality of sub-chambers.

6. The chucking system as recited in claim 1 wherein said first support region is concentric about said second support region and has a shape that is selected from a set of shapes consisting of annular, polygonal and circular.

7. The chucking system as recited in claim 1 further including a means coupled to bend said substrate to curve to a desired shape.

8. The chucking system as recited in claim 1 further including a pressure control system in fluid communication with said throughway, with said substrate resting against said first and second support regions, covering said first and second recesses, with said first recess and a portion of said substrate in superimposition therewith defining a first chamber and said second recess and a portion of said substrate in superimposition therewith defining a second chamber, with said pressure control system operating to control a pressure in one of said first and second chambers.

9. The chucking system as recited in claim 1 further including providing an additional throughway, with said throughway and said additional throughway placing each of said first and second recesses in fluid communication with one of said exterior surfaces and including a pressure control system in fluid communication with both said throughway and said additional throughway, with said substrate resting against said first and second support regions, covering said first and second recesses, with said first recess and a portion of said substrate in superimposition therewith defining a first chamber and said second recess and a portion of said substrate in superimposition therewith defining a second chamber with said pressure control system operating to create a pressure differential between said first and second chambers.

10. The chucking system as recited in claim 1 further including providing an additional throughway, with said throughway and said additional throughway placing each of said first and second recesses in fluid communication with one of said exterior surfaces, including a pressure control system in fluid communication with both said throughway and said additional throughway, and means, coupled to bend said substrate so as to curve opposed sides thereof, with said substrate resting against said first and second support regions, covering said first and second recesses, with said first recess and a first portion of said substrate in superimposition therewith defining a first chamber and said second recess and a second portion of said substrate in superimposition therewith defining a second chamber with said pressure control system operating to control a pressure in said second chamber to modulate a curvature of said second portion.

11. The chucking system as recited in claim 1 further including a wall disposed within said first recess, extending between said first and second support regions to segment said first recess into a plurality of sub-chambers, and a pressure control system in fluid communication with said throughway, wherein said substrate rests against said first and second support regions, covering said first recess, with said first recess and a portion of said substrate in superimposition therewith defining a first chamber with said pressure control system operating to control a pressure in said plurality of sub-chambers to create a pressure differential therebetween.

12. A chucking system to hold a substrate, said chucking system comprising:

a chuck body having first and second opposed sides with an edge surface extending therebetween, said first side including first and second spaced-apart recesses defining first and second spaced-apart support regions, with said first support region cincturing said second support region and said first and second recesses, and said second support region cincturing said second recess, with a portion of said chuck body in superimposition with said second recess being transparent to radiation having a predetermined wavelength, said portion extending from said second side and terminating proximate to said second recess, said second side and said edge surface defining exterior surfaces, with said body including first and second throughways extending through said chuck body, with said first throughway placing said first recess in fluid communication with one of said exterior surfaces and said second throughway extending through said chuck body placing said second recess in fluid communication with one of said exterior surfaces, each of said first and second support regions having a support surface associated therewith, facing away from said second side, with said support surface being formed from a material adapted to be compliant in a first direction extending between said first and second opposed sides to conform to a profile of said substrate.

13. The chucking system as recited in claim 12 further including a wall disposed within said second recess, extending between said first and second support regions to segment said first recess into a plurality of chambers.

14. The chucking system as recited in claim 12 wherein said first support region is concentric about said second support region and has a shape that is selected from a set of shapes consisting of annular, polygonal and circular.

15. The chucking system as recited in claim 12 further including a pneumatic bladder coupled to bend said substrate so as to curve opposed sides thereof.

16. The system as recited in claim 12 wherein said material is resistant to movement in a direction transverse to said first direction.

17. The chucking system as recited in claim 15 further including a pressure control system in fluid communication with said first and second throughways, with said substrate resting against said first and second support regions, covering said first and second recesses, with said first recess and a first portion of said substrate in superimposition therewith defining a first chamber and said second recess and a second portion of said substrate in superimposition therewith defining a second chamber with said pressure control system operating to control a pressure in said first chamber and second chamber, with the pressure within said second chamber established to modulate a curvature of said second portion.

18. The chucking system as recited in claim 12 wherein said first recess includes a plurality of spaced-apart pins extending therefrom.

19. A chucking system to hold a substrate, said chucking system comprising:

a chuck body having first and second opposed sides with a side surface extending therebetween, said first side including first and second spaced-apart recesses defining first and second spaced-apart support regions, with said first support region cincturing said second support region and said first and second recesses, and said second support region cincturing said second recess, said second side and edge surfaces defining exterior surfaces, with said chuck body including a throughway extending through said chuck body placing one of said first and second recesses in fluid communication with one of said exterior surfaces, said substrate resting against said first and second support regions, covering said first and second recesses, with said first recess and a portion of said substrate in superimposition therewith defining a first chamber and said second recess and a portion of said substrate in superimposition therewith defining a second chamber, with a portion of said chuck body in superimposition with said second recess being transparent to radiation having a predetermined wavelength, with said portion extending from said second side, terminating proximate to said second recess; and a pressure control system, said first throughway placing said one of said first and second recesses in fluid communication, with said pressure control system operating to create a pressure differential between said first and second chambers to modulate a curvature of said substrate.

20. The chucking system as recited in claim 19 further including a means coupled to said body for bending said substrate so as to curve opposed sides thereof.

21. The chucking system as recited in claim 19 further including a wall disposed within said first recess, extending between said first and second support regions to segment said first recess into a plurality of sub-chambers, with said pressure control system operating to create differing pressures among said plurality of sub-chambers.

22. The chucking system as recited in claim 19 wherein said first support region is concentric about said second support region and has a shape that is selected from a set of shapes consisting of annular, polygonal and circular.

23. The chucking system as recited in claim 1 further including a means coupled to bend said substrate so as to curve to a shape of one of said first and second opposed sides.

24. The chucking system as recited in claim 1 further including a pressure control system in fluid communication with said throughway, with said substrate resting against said first and second support regions, covering said first and second recesses, with said first recess and the portion of said substrate in superimposition therewith defining a first chamber and said second recess and the portion of said substrate in superimposition therewith defining a second chamber with said pressure control system operating to control a pressure in one of said first and second chambers.

* * * * *

UNITED STATES PATENT AND TRADEMARK OFFICE
CERTIFICATE OF CORRECTION

PATENT NO. : 7,019,819 B2  Page 1 of 1
APPLICATION NO. : 10/293224
DATED : March 28, 2006
INVENTOR(S) : Choi et al.

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by (237) days Delete the phrase "by 237 days" and insert -- by 345 days--

Signed and Sealed this

Thirtieth Day of October, 2007

JON W. DUDAS
*Director of the United States Patent and Trademark Office*